(12) United States Patent
Luo

(10) Patent No.: US 10,566,990 B2
(45) Date of Patent: Feb. 18, 2020

(54) SEGMENTED RESISTOR STRING TYPE DIGITAL TO ANALOG CONVERTER AND CONTROL SYSTEM THEREOF

(71) Applicant: CSMC TECHNOLOGIES FAB2 CO., LTD., Wuxi New District, Jiangsu (CN)

(72) Inventor: Chuan Luo, Jiangsu (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 16/344,734

(22) PCT Filed: Nov. 3, 2017

(86) PCT No.: PCT/CN2017/109311
§ 371 (c)(1),
(2) Date: Apr. 24, 2019

(87) PCT Pub. No.: WO2018/082656
PCT Pub. Date: May 11, 2018

(65) Prior Publication Data
US 2019/0334543 A1 Oct. 31, 2019

(30) Foreign Application Priority Data
Nov. 4, 2016 (CN) .......................... 2016 1 0963002

(51) Int. Cl.
*H03M 1/66* (2006.01)
*H03M 1/68* (2006.01)
(Continued)

(52) U.S. Cl.
CPC ............ *H03M 1/687* (2013.01); *H03K 19/20* (2013.01); *H03M 1/00* (2013.01); *H03M 1/0646* (2013.01); *H03M 1/66* (2013.01); *H03M 1/80* (2013.01)

(58) Field of Classification Search
CPC ........ H03M 1/00; H03M 1/0646; H03M 1/66; H03M 1/80
(Continued)

(56) References Cited

U.S. PATENT DOCUMENTS 5,977,898 A 11/1999 Ling et al.
6,914,547 B1 * 7/2005 Swaroop ............... H03M 1/682
341/144

FOREIGN PATENT DOCUMENTS

| CN | 101056106 | 10/2007 |
|---|---|---|
| CN | 101908887 | 12/2010 |
| WO | 0128102 | 4/2001 |

OTHER PUBLICATIONS

International Search Report issued for International Patent Application No. PCT/CN2017/109311, dated Jan. 29, 2018, 5 pages including English translation.

* cited by examiner

*Primary Examiner* — Joseph J Lauture
(74) *Attorney, Agent, or Firm* — Hamre, Schumann, Mueller & Larson, P.C.

(57) ABSTRACT

A segmented resistor string type digital to analog converter comprises: a most significant bit (MSB) resistor string (104) comprising a high level resistor string, an intermediate level resistor string and a ground level resistor string; a decoding circuit (101), configured to decode an n-bit code of the MSB resistor string (104) and output $2^n$ decoded codes; a logic sequential generation circuit (102), connected to the decoding circuit (101) and configured to perform a logic operation on a middle-position code among the $2^n$ decoded codes and a refresh clock signal in non-overlapping sequences, and output two groups of control signals with completely complementary high level durations; a control signal bootstrap circuit (103), connected to the logic sequential gen- (Continued)

eration circuit (102) and configured to perform bootstrap processing on the control signal, and increase the high level of the control signal to a sum of a power supply voltage and a threshold voltage; and a first switch group (106), connected to the control signal bootstrap circuit (103) and the intermediate level resistor string, where on/off of the first switch group (106) is controlled by the control signal after the bootstrap processing, so as to connect the intermediate level resistor string to the circuit or disconnect the intermediate level resistor string from the circuit.

18 Claims, 4 Drawing Sheets

(51) Int. Cl.
    *H03K 19/20*     (2006.01)
    *H03M 1/80*     (2006.01)
    *H03M 1/06*     (2006.01)
    *H03M 1/00*     (2006.01)

(58) Field of Classification Search
    USPC .................................. 341/145, 144, 154, 153
    See application file for complete search history.

CONVENTIONAL SEGMENTED RESISTOR
STRING TYPE DAC

SEGMENTED RESISTOR STRING TYPE DIGITAL TO ANALOG CONVERTER AND CONTROL SYSTEM THEREOF

TECHNICAL FILED

The present disclosure relates to a digital to analog converter, particularly to a segmented resistor string type digital to analog converter with stable performance, and also to a control system for segmented resistor string type digital to analog converter.

BACKGROUND

FIG. 1 shows a structural schematic diagram of a segmented resistor string type digital to analog converter (DAC) in the prior art. In such conventional segmented resistor string type DAC, taking a 12-bit DAC as an example, upper 7 bits are called the most significant bits (MSBs), with 128 MSB resistors, and lower 5 bits are called the least significant bits (LSBs), with 32 LSB resistors. In practical applications, the number of bits for the MSBs may be selected from 4 to 8, and accordingly the number of bits for the LSBs may be selected from 8 to 4 bits, according to different requirements of a system. In a conventional segmented-type DAC, considering matching, a MSB resistor string and a LSB resistor string generally select resistors having the same resistance. In order to reduce influences of the LSB resistor string on the MSB resistor string, current compensation on the LSB resistor string or isolation of a front sub-DAC and a rear sub-DAC by an operational amplifier is generally required, which requires additional circuits and increases design difficulties. In addition, a switch resistance between the MSB resistor string and the LSB resistor string of the segmented-type DAC may also seriously affect linearity. In order to improve differential nonlinearity (DNL), a switching mode of the switch needs to be optimized.

However, the DAC requires a larger number of transmission gate switches. How to reduce an area of the switches and parasitic effects also are problems to be considered in the design. Secondly, a switching mode of the switches is changed from simultaneous switching of two ends of the LSB resistor to alternate switching of the two ends each time. As shown in FIG. 2, the switches have an inherent resistor Rsw, and a voltage Vcd across the two ends of the LSB resistor string is not equal to a voltage Vab between points a and b of the MSB resistor string, thus when adjacent bits of the MSB resistor string are switched, if two switches are simultaneously turned on, there is a serious influence on differential nonlinearity (DNL) due to a part of voltage across the resistors of the switches themselves (influence caused by the two Rsw).

The technique in the prior art is suitable for applications where a power supply voltage does not significantly change. However, in many applications, the power supply voltage has a quite large changing range, and sometimes the power supply voltage may change in the range of 2V to 5V or lower or higher. When there is a low voltage and a low temperature and a transistor is at a slow process angle, since a threshold voltage of the transistor will increase significantly at the low temperature, which results in that when a middle-position switch of the MSB resistor string is turned on, an on-resistance Rsw will be very large, which will cause significant degradation to performance of the circuit. Simply increasing a width-to-length ratio of the transistor to reduce Rsw will result in a very large area of the switches and high costs.

SUMMARY

In view of the above, it is necessary to provide a segmented resistor string type digital to analog converter and a control system thereof with stable performance.

A control system for segmented resistor string type digital to analog converter includes a MSB resistor string and a LSB resistor string, and further includes a decoding circuit, a logic sequential generation circuit, a control signal bootstrap circuit and a first switch group.

The decoding circuit is connected to the logic sequential generation circuit. The logic sequential generation circuit is connected to the control signal bootstrap circuit. The control signal bootstrap circuit is connected to the first switch group.

The MSB resistor string includes a high level resistor string, an intermediate level resistor string and a ground level resistor string. The high level resistor string is configured to be connected to a high level switch group. The ground level resistor string is configured to be connected to a ground level switch group. The intermediate level resistor string is configured to be connected to the first switch group. The LSB resistor string is connected to the MSB resistor string through the ground level switch group.

The decoding circuit is configured to decode an n-bit code of the MSB resistor string, and output $2^n$ decoded codes to the logic sequential generation circuit. The logic sequential generation circuit is configured to perform a logic operation on a middle-position code among the $2^n$ decoded codes and a refresh dock signal in non-overlapping sequences, and output two groups of control signals with completely complementary high level durations to the control signal bootstrap circuit. The control signal bootstrap circuit is configured to increase a high level to a sum of a power supply voltage and a threshold voltage according to the control signals. The first switch group is configured to be turned on or off according to the sum of the power supply voltage and the threshold voltage.

A segmented resistor string type digital to analog converter includes: a MSB resistor string, including a high level resistor string, an intermediate level resistor string and a ground level resistor string; a decoding circuit, configured to decode an n-bit code of the MSB resistor string and output $2^n$ decoded codes; a logic sequential generation circuit, connected to the decoding circuit and configured to perform a logic operation on a middle-position code among the $2^n$ decoded codes and a refresh clock signal in non-overlapping sequences, and output two groups of control signals with completely complementary high level durations; a control signal bootstrap circuit, connected to the logic sequential generation circuit and configured to boost the control signals so that a high level of each of the control signals is increased to a sum of a power supply voltage and a threshold voltage; and a first switch group, connected to the control signal bootstrap circuit and the intermediate level resistor string, wherein the first switch group is controlled by the boosted control signals to be turned on or off, so as to connect the intermediate level resistor string to the circuit or disconnect the intermediate level resistor string from the circuit.

The above-described control system for segmented resistor string type digital to analog converter divides the MSB resistor string into three groups. One of the three groups which is most sensitive to changes of the power supply voltage and the temperature is controlled by a group of switches, that is, the first switch group, and a control voltage generated by the control signal bootstrap circuit is used for controlling the first switch group. In addition, the logic sequential generation circuit is introduced to ensure continuity of output signals of the digital to analog converter, which suppresses performance degradation of the control signal bootstrap circuit due to leakage at a low frequency.

DETAILED DESCRIPTION OF THE EMBODIMENTS

In order to facilitate understanding of the present disclosure, the present disclosure will be described more fully below with reference to related accompanying drawings. Preferable embodiments of the present disclosure are set forth in the accompanying drawings. However, the present disclosure may be embodied in many different forms and is not limited to the embodiments described herein. Rather, these embodiments are provided so that the understanding of the disclosure of the present disclosure will be more thorough.

It should be understood that when an element is defined as "fixed to" another element, it is either directly on another element or indirectly on another element with an intermediate element. When an element is considered to be "connected" to another element; it can be directly connected to another element or indirectly connected to another element with an intermediate element. The terms "vertical", "horizontal", "left", "right", and similar expressions are used herein for illustrative purposes only.

All technical and scientific terms used herein have the same meaning as commonly understood by one of ordinary skill in the art, unless otherwise defined. The terms used herein are for the purpose of describing specific embodiments only and are not intended to limit the present disclosure. The term "and/or" used herein includes any and all combinations of one or more of the associated listed items.

Figure 3:
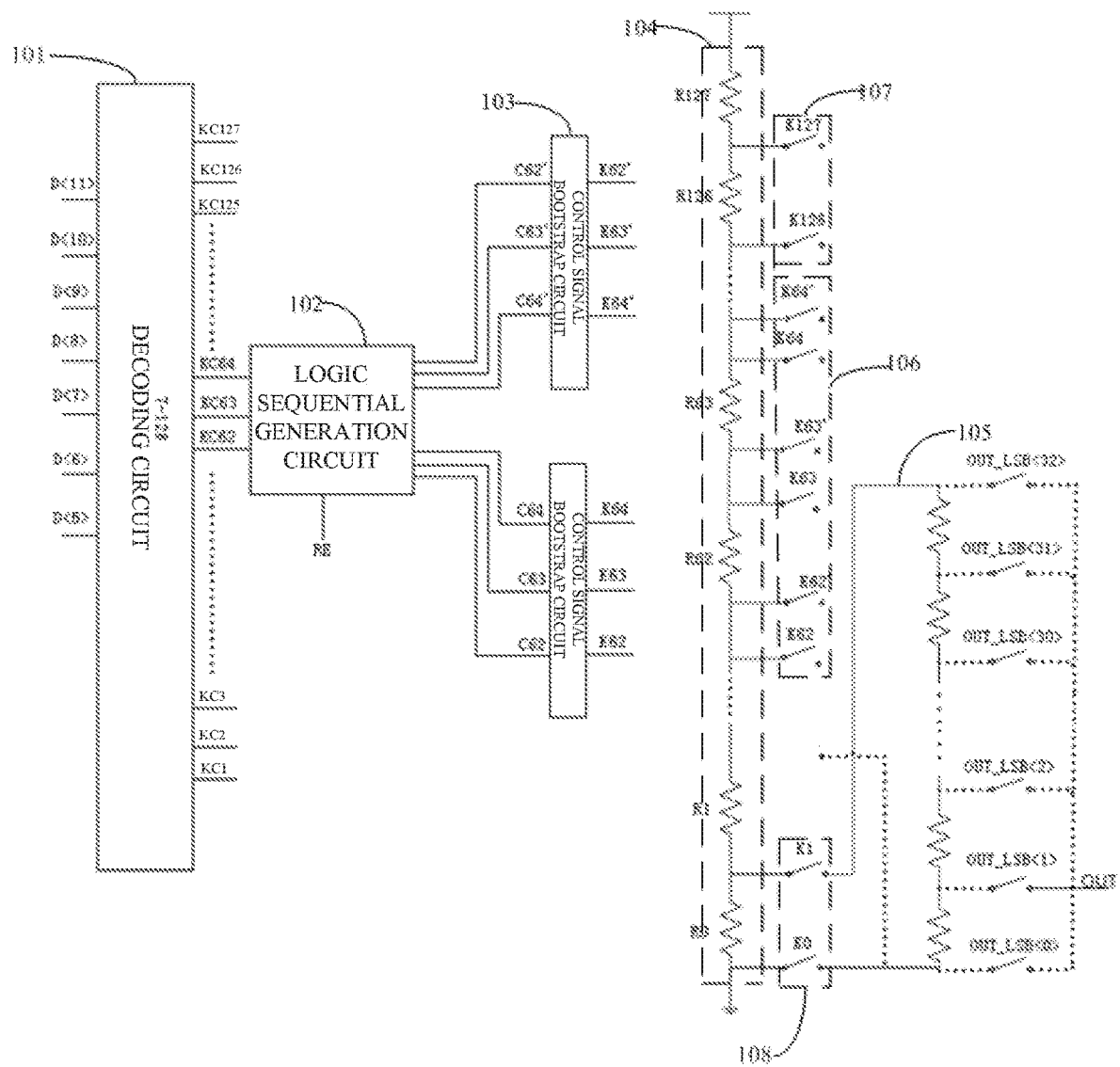
FIG. 3 is a structural schematic diagram of a control system for segmented resistor string type digital to analog converter.

FIG. 3 shows a structural schematic diagram of a control system for segmented resistor string type digital to analog converter.

The control system for segmented resistor string type digital to analog converter includes a MSB resistor string 104 and a LSB resistor string 105, and further includes a decoding circuit 101, a logic sequential generation circuit 102, a control signal bootstrap circuit 103 and a first switch group 106.

The decoding circuit 101 is connected to the logic sequential generation circuit 102. The logic sequential generation circuit 102 is connected to the control signal bootstrap circuit 103. The control signal bootstrap circuit 103 is connected to the first switch group 106.

The MSB resistor string 104 includes a high level resistor string, an intermediate level resistor string and a ground level resistor string. The high level resistor string is configured to be connected to a high level switch group 107. The ground level resistor string is configured to be connected to a ground level switch group 108. The intermediate level resistor string is configured to be connected to the first switch group 106. The LSB resistor string 105 is connected to the MSB resistor string 104 through the ground level switch group 108.

The decoding circuit 101 is configured to decode an n-bit code of the MSB resistor string 104, and output $2^n$ decoded codes to the logic sequential generation circuit 102. The logic sequential generation circuit 102 is configured to perform a logic operation on a middle-position code among the $2^n$ decoded codes and a refresh clock signal in non-overlapping sequences, and output two groups of control signals with completely complementary high level durations to the control signal bootstrap circuit 103. The control signal bootstrap circuit 103 is configured to increase a high level to a sum of a power supply voltage and a threshold voltage according to the control signals. The first switch group is configured to be turned on or off according to the sum of the power supply voltage and the threshold voltage.

Specifically, after the n-bit code of the MSB resistor string 104 passes through the decoding circuit 101, $2^n$ decoded codes are output, and then a part of key-position codes close to the middle position are selected from the output $2^n$ decoded codes to perform the logic operation with the refresh clock signal in non-overlapping sequences, to obtain two groups of the control signals with completely complementary high level durations. After the two groups of control signals passes through the control signal bootstrap circuit 103, the high level is increased to the sum of the power supply voltage and the threshold voltage, that is, VDD+Vth. These signals are used to control a part of the two key groups of complementary alternating switches in the MSB resistor string, thereby greatly improving performance of output linearity of the digital to analog converter and maintaining continuity of the output.

The above-described control system for segmented resistor string type digital to analog converter divides the MSB resistor string 104 into three groups, and the switches corresponding to the three groups of resistors are divided into three groups. One of the three groups of the resistors that is the most sensitive to the changes of the power supply voltage and the temperature is controlled by a group of switches, that is, the first switch group 106, and the control voltage generated by the control signal bootstrap circuit 103 is used to control the first switch group 106. In addition, the logic sequential generation circuit 102 is introduced to ensure the continuity of the output signals of the digital to analog converter, which suppresses performance degradation of the control signal bootstrap circuit 103 due to leakage at a low frequency.

The first switch group 106 adopts a switch of a field effect transistor structure.

The high level switch group 107 adopts a switch of a single PMOS transistor structure.

The ground level switch group 108 adopts a switch of a single NMOS transistor structure.

Each switch of the first switch group 106 corresponds to a complementary switch.

Specifically, the switches corresponding to the MSB resistor string 104 are divided into three parts. The switches close to a power supply level are the high level switch group 107, adopting the single PMOS transistor as the switches. The switches close to a ground level are the ground level switch group 108, adopting the single NMOS transistor as the switches. The switches in the middle that are the most sensitive to the voltage and the temperature are the first switch group 106, all adopting the switches of a CMOS structure.

Figure 5:
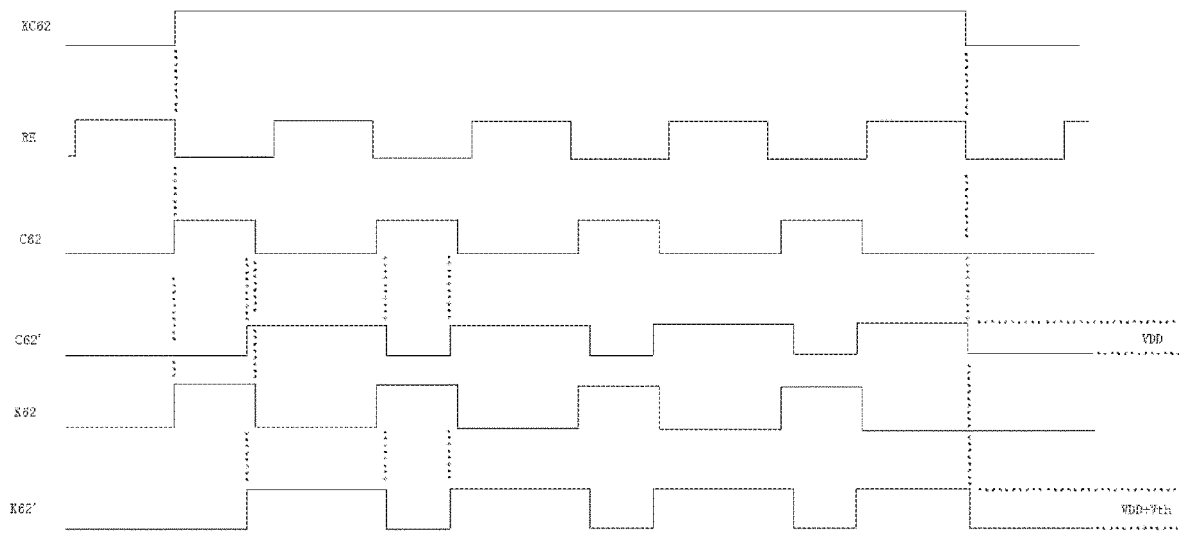
FIG. 5 is a logical relationship diagram of control signals.

In this embodiment, the first switch group 106 is controlled by a bootstrap control signal, thus each switch of the first switch group 106 has a complementary switch for matching use with each other, such as K62 and K62', being a group of the complementary switches. The function of each group of the complementary switches is to always ensure that one of the K62 and K62' is maintained at a high level during the time when the corresponding control signal such as KC62 is at a high level, as shown in FIG. 5, thereby ensuring the continuity of an analog level output by the digital to analog converter.

Figure 4:
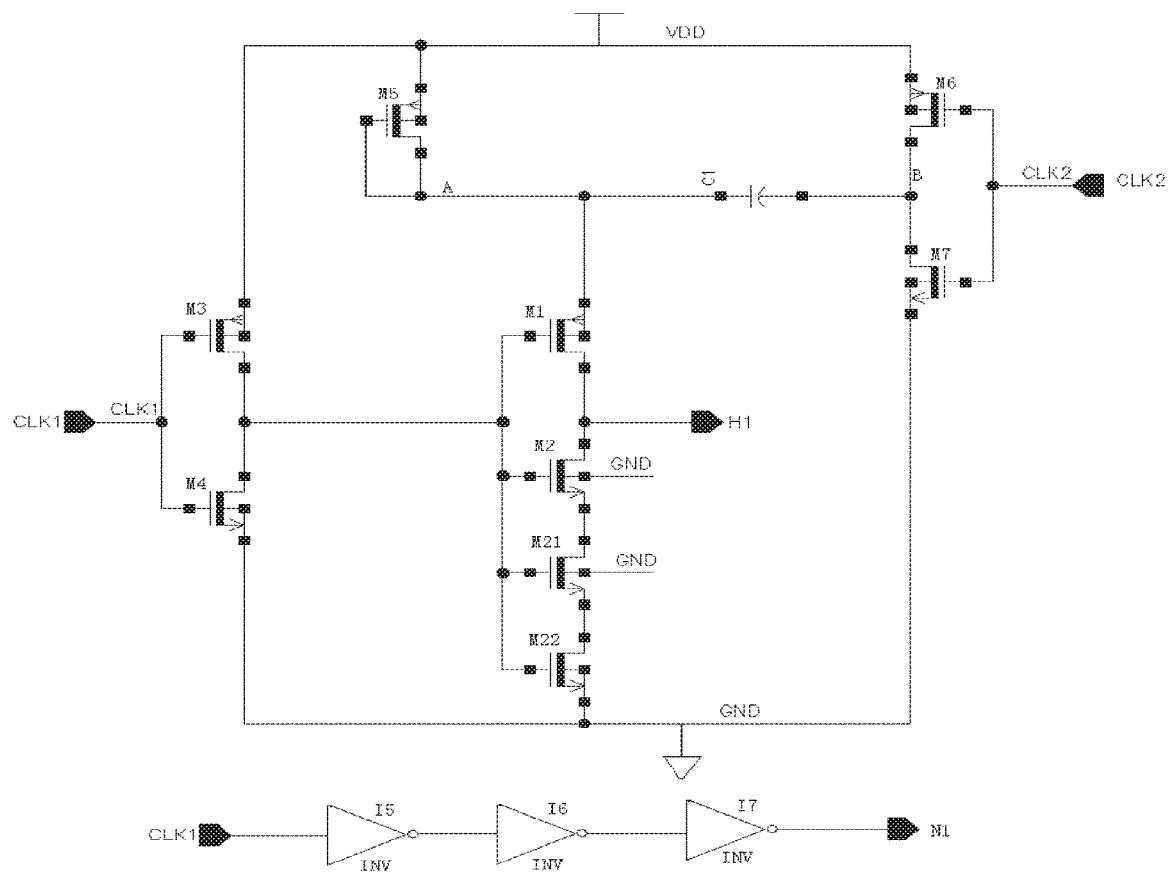
FIG. 4 is a schematic diagram of a control signal bootstrap circuit.

FIG. 4 is a schematic diagram of the control signal bootstrap circuit 103.

The control signal bootstrap circuit 103 includes a transistor M1, a transistor M2, a transistor M3, a transistor M4, a transistor M5, a transistor M6, a transistor M7, a transistor M21 and a transistor M22.

A first clock signal is input into a gate electrode of the transistor M3 and a gate electrode of the transistor M4, a drain electrode of the transistor M3 is connected to a drain electrode of the transistor M4, a source electrode of the transistor M3 is connected to the power supply voltage, and a source electrode of the transistor M4 is grounded.

A second clock signal is input into a gate electrode of the transistor M6 and a gate electrode of the transistor M7, a source electrode of the transistor M6 is connected to the power supply voltage, a source electrode of the transistor M7 is grounded, and a drain electrode of the transistor M6 is connected to the drain electrode of the transistor M7.

A source electrode of the transistor M5 is connected to the power supply voltage, and a gate electrode of the transistor M5 is connected to a drain electrode of the transistor M5, and then is connected to a source electrode of the transistor M1.

A common connection point between the drain electrode of the transistor M6 and the drain electrode of the transistor M7 is connected to the source electrode of the transistor M1.

A common connection point between the drain electrode of the transistor M3 and the drain electrode of the transistor M4 is simultaneously connected to a gate electrode of the transistor M1, a gate electrode of the transistor M2, a gate electrode of the transistor M21 and a gate electrode of the transistor M22. A common connection point between a drain electrode of the transistor M1 and a drain electrode of the transistor M2 outputs a high-level signal H1, a source electrode of the transistor M2 is connected to a drain electrode of the transistor M21, a source electrode of the transistor M21 is connected to a drain electrode of the transistor M22, and a source electrode of the transistor M22 is grounded.

The control signal bootstrap circuit 103 further includes a NOT gate I7, a NOT gate I7 and a NOT gate I7.

The NOT gate I7, the NOT gate I7 and the NOT gate I7 are connected sequentially. The first clock signal is input into the NOT gate I5, and the NOT gate I7 outputs a low-level signal N1.

A level of the switch control signal may be increased by the above-described control signal bootstrap circuit 103 from the power supply voltage VDD to VDD+Vth (the threshold voltage), which not only greatly reduces the on-resistances of the switches that are controlled by the control signal bootstrap circuit 103, but also does not cause the control voltages to be too high so that there is a risk of breakdown of the switches.

The transistor M2 the transistor M21, the transistor M22, the transistor M4 and the transistor M7 are all TWOS transistors.

The transistor M3, the transistor M1, the transistor M5 and the transistor M6 are all PMOS transistors.

The control signal bootstrap circuit 103 further includes an electrolytic capacitor C1. A negative electrode of the electrolytic capacitor C1 is connected to the common connection point between the drain electrode of the transistor M6 and the drain electrode of the transistor M7. A positive electrode of the electrolytic capacitor C1 is connected to the source electrode of the transistor M1.

Since a capacitor is used in the control signal bootstrap circuit 103, there is a defect that once the control signal such as KC62 is maintained at a high level for a long time, that is, a frequency of the change of the control signal is too low, charges on the capacitor in the bootstrap circuit will all leak out through channels of the three NMOS, i.e., the transistor M2, the transistor M21 and the transistor M22, resulting in that the control voltage output by the control signal bootstrap circuit 103 is reduced to VDD again. Therefore, a refresh clock signal needs to be introduced into the logic sequential generation circuit 102, and the main function of the refresh clock signal is to perform the logic operation with the signal such as KC62 to generate a group of complementary control signals C62 and C62'. Frequencies of the refresh clock signal and the signals such as C62 and C62' are at least an integer multiple more than twice of that of the signal KC62. Since such as the C62 and the C62' have a much faster frequency, a leakage time of the charges on the capacitor in the control signal bootstrap circuit 103 is greatly shortened, and the control levels of the corresponding boosted K62 and K62' are not easily influenced by discharge of the charges on the capacitor, solving the problem of the control signal bootstrap circuit 103 at a low frequency.

Please refer to FIG. 5.

During the time when for example the signal KC62 is maintained at a high level, at least one of the two complementary control signals C62 and C62' can always be maintained at a high level, and when the KC62 is at a low level, both the C62 and the C62' are zero, which ensures that, as seen from an output end of the digital to analog converter, the frequency of the change of the analog level output by the digital to analog converter and the frequency of the change of the signals such as the KC62 are consistent and synchronous, thus ensuring the continuity of the analog level output by the digital to analog converter.

The refresh clock signal is mainly used when the digital to analog converter operates at an extremely low rate. The refresh clock signal may be turned off and not be used, when the digital to analog converter is used at a high rate. When the refresh clock signal is not used, C62 to C64 output by the logic sequential generation circuit 102 are the control signals having the same frequencies and being synchronous with KC62 to KC64. At this time, C62' to C64' are zero, and only operations of the K62 to K64 among the switches of MSB are already sufficient, and K62' to K64' are maintained in an off state.

Based on all the above-described embodiments, operation principle of the control system for segmented resistor string type digital to analog converter is as follows.

A 12-bit DAC is taken as an example, where the MSBs has 7 bits, and the LSBs has 5 bits. In a practical engineering project, a total bit number may be more or less, and allocation of the numbers of the bits for the MSBs and the LSBs may also be selected flexibly according to different performance requirements. D<5:11> in FIG. 3 are seven MSB codes, on which the decoding circuit 101 performs logic operation to output 128 specific original switch control signals. The 128 signals are divided into three groups. KC0 to KC61 are in a group, used to directly control switches K0 to K61. KC65 to KC127 are in a group, used to directly control switches K65 to K127. KC62 to KC64 are used to control the most key three switches K62 to K64, so the KC62 to KC64 need to be processed and be boosted before use.

In this embodiment, for convenience of explanation and understanding, only three switches are selected as key switches. The number of the key switches in a practical circuit application may be selected flexibly according to performance indexes such as operation environment and accuracy of the circuit. When the DAC has a low minimum power supply voltage, and a low minimum temperature of operation, in order to ensure that linear performance output by the DAC is good enough, taking the 7-bit MSB as an example, the number of the key switches is generally not less than 20.

The signal RE in FIG. 3 is a refresh clock signal. After the refresh clock signal is performed a circuit operation with the KC62 to KC64 respectively in complementary logic non-overlapping sequences, two groups of the complementary control signals C62 to C64 and C62' to C64' are obtained. The generated complementary signals are all zero during the time when the corresponding signals KC62 to KC64 are zero. A sequential relationship during the time when the KC62 to KC64 are at a high level is shown as FIG. 5, where a frequency of the signal RE is much faster than the frequency of the change of the signals KC62 to KC64. In FIG. 5, only the KC62 and the corresponding signals such as C62 are selected as an example for description. The two complementary control signals C62 and C62' can always be maintained that at least one of them is at a high level, that is, during the time when the KC62 is maintained at a high level, at least one of the C62 and the C62' can be maintained in a high-level state. After passing through the control signal bootstrap circuit 103, the C62 and the C62' become the final switch control signal K62 and K62', the sequential relationship does not change, but the control voltage is increased to VDD+Vth, which can effectively reduce the on-resistances of the controlled switches. A state that although the K62 and the K62' are alternatively turned on, at least one switch is turned on at any time may result in that a waveform of the analog level output by the DAC is continuous and free of glitches, greatly reducing the leakage of the capacitor in the control signal bootstrap circuit 103 when the signal KC62 has an extremely low frequency.

The 128 switches corresponding to the MSB resistor string 104 are divided into three groups. The K0 to K61 close to the ground level are in a group, and since voltages transmitted by this group of the switches are low, the single NMOS transistors may be adopted as the switches. The K65 to K127 close to the power supply voltage are in a group, and since voltages transmitted by this group of the switches are high, the single PMOS transistors may be adopted as the switches. Since the K62 to K64 in the middle transmit just intermediate levels, the on-resistances of these switches are greatly influenced by the temperature, the voltage and process corners, so they need to be controlled by the boosted control signals. After the control signals are boosted, the control voltages will be raised by one Vth (the threshold voltage), which is about 0.7 V, That is, the control voltages of these switches are higher than the control voltages of the other two groups of the switches by about 0.7 V, which will greatly reduce a layout area of these switches, and reduce the cost.

In addition, for the convenience of illustration, only the three switches in the middle are selected as one group in the schematic diagram. In practical uses, the respective number of the switches in the three groups of the switches may be determined according to the requirement on the circuit, and the number of the switches in the middle may be increased when the requirement on the circuit is higher. In addition, the MSB being 7 bits is taken as an example in FIG. 3, thus there are 128 MSB switches. When the MSB has a different bit number, the number of the switches will also change correspondingly. If the bit number of the MSB is n, the number of the switches is $2^n$.

Each switch in the switch group that uses the bootstrap control signals has a complementary switch for matching use with each other, such as K62 and K62', being a group of complementary switches. The function of each group of the complementary switches is to always ensure that one of the K62 and the K62' is maintained at a high level during the time when the corresponding control signal such as KC62 is at a high level, as shown in FIG. 5, thereby ensuring the continuity of the analog level output by the digital to analog converter.

The level of the switch control signal may be increased by the control signal bootstrap circuit 103 from the power supply voltage VDD to VDD+Vth, which may not only greatly reduces the on-resistances of the switches that are controlled by the control signal bootstrap circuit 103, but also does not cause the control voltages to be too high so that there is a risk of breakdown of the switches.

Since a capacitor is used in the control signal bootstrap circuit 103, there is a defect that once the control signal such as KC62 is maintained at a high level for a long time, that is, the frequency of the change of the control signal is too low, charges on the capacitor in the control signal bootstrap circuit 103 will all leak out through the channels of the three NMOS, i.e., the transistor M2, the transistor M21 and the transistor M22, resulting in that the control voltage output by the control signal bootstrap circuit 103 is reduced to VDD again. Therefore, a refresh clock signal is introduced into the logic sequential generation circuit, and the main function of the signal is to perform a logic operation with the signals such as KC62 to generate a group of the complementary control signal C62 and C62'. Frequencies of the refresh clock signal and the signals such as C62 and C62' are at least an integer multiple more than twice of that of the signal KC62. Since such as the C62 and C62' have a much faster frequency, the leakage time of the charges on the capacitor in the control signal bootstrap circuit 103 is greatly shortened, and the control levels of the corresponding boosted K62 and K62' are not easily influenced by the discharge of the charges on the capacitor, solving the problem of the bootstrap circuit at a low frequency.

During the time when for example the signal KC62 is maintained at a high level, at least one of the two complementary control signals C62 and C62' can always be maintained at a high level, and when the KC62 is at a low level, both the C62 and the C62' are zero, which ensures that, as seen from an output end of the digital to analog converter, the frequency of the change of the analog level output by the digital to analog converter and the frequency of the change of the signals such as the KC62 are consistent and synchronous, thus ensuring the continuity of the analog level output by the digital to analog converter.

The refresh clock signal is mainly used when the DAC operates at an extremely low rate. The refresh clock signal may be turned off and not be used, when the DAC is used at a higher rate. When the refresh clock signal is not used, the C62 to C64 output by the non-overlapping logic sequential generation circuit 102 are the control signals having the same frequencies and being synchronous with the KC62 to KC64. At this time, the C62' to C64' are zero, and only the operations of the K62 to K64 among the switches of MSB are already sufficient, and the K62' to K64' are maintained in an off state.

Figure 1:
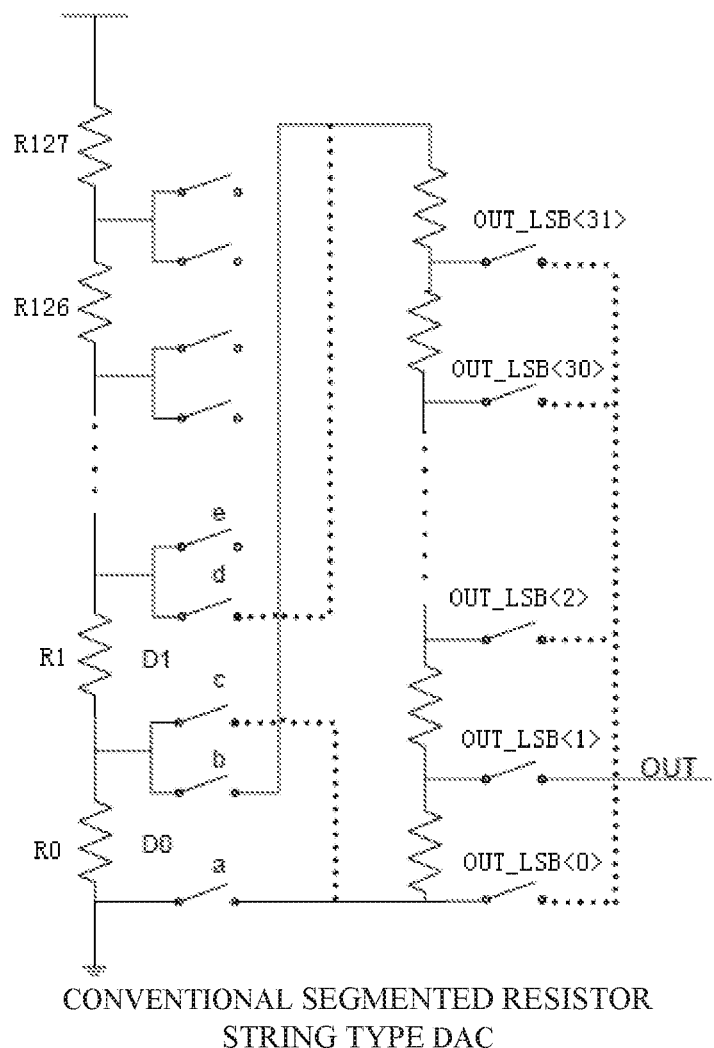
FIG. 1 is a structural schematic diagram of a segmented resistor string type DAC in the prior art.
Figure 2:
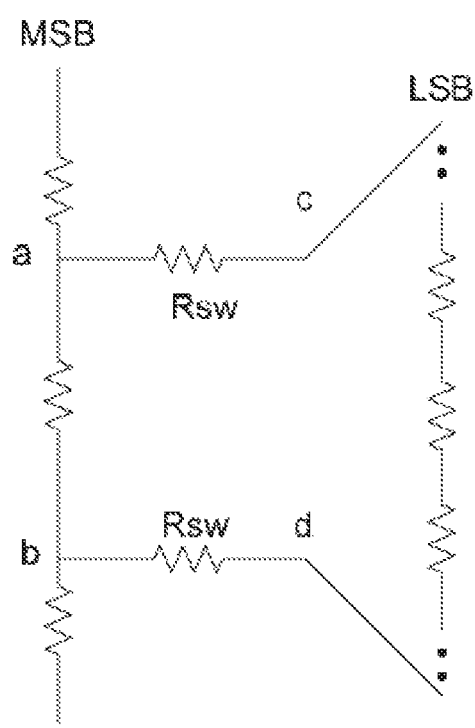
FIG. 2 is a schematic diagram showing influences of a switch resistance on a segmented resistor string type DAC in the prior art.

Based on the above-described embodiments, refer to FIG. 2 and FIG. 3 at the same time. When adjacent bits of the MSB resistor string 104 are switched, only one switch of the LSB resistor string 105 is turned on. It is easy to see that, when a point d is off, a voltage at point c is equal to a voltage at point a, so that the influence of the switch resistance on the resistance of the MSB is greatly reduced, thereby greatly improving the linearity of the DAC. When the DAC of such an improved structure is switched, after the previous point a is switched to a point c, an order from OUT_LSB<0> to OUT_LSB<32> also needs to be reversed, which may be implemented by corresponding digital logic circuits. Compared with a conventional structure, only the logic decoding circuit 101 for controlling on/off of each switch in the above-described control system for segmented resistor string type digital to analog converter becomes a little more complicated, but the improvement to the performance of the digital to analog converter is significant.

Compared with the previous structure, the above-described control system for segmented resistor string type digital to analog converter is simple in principle. Although the logic control part is complicated, the switches corresponding to the MSB resistor string 104 may be selected to be small in size, and an area of the final layout is still reduced. In addition, the control system for segmented resistor string type digital to analog converter may be applied to the digital to analog converter at an extremely low rate, and may also be applied to the digital to analog converter at a high rate. The requirement on the power supply voltage is also not high, and the performance is very stable at a low temperature, a low pressure and a slow process angle, thus the applicable range is much wider than that of the previous structures.

Each of the technical features of the above-described embodiments may be combined arbitrarily. To simplify the description, not all the possible combinations of each of the technical features in the above embodiments are described. However, all of the combinations of these technical features should be considered as within the scope of the present specification, as long as such combinations do not contradict with each other.

The above-described embodiments merely represent several embodiments of the present disclosure, and the description thereof is more specific and detailed, but it should not be construed as limiting the scope of the present disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

What is claimed is:

1. A control system for segmented resistor string type digital to analog converter, comprising:
   a most significant bit (MSB) resistor string, comprising a high level resistor string, an intermediate level resistor string and a ground level resistor string, the high level resistor string being configured to be connected to a high level switch group, and the ground level resistor string being configured to be connected to a ground level switch group;
   a least significant bit (LSB) resistor string, connected to the MSB resistor string through the ground level switch group;
   a decoding circuit, configured to decode an n-bit code of the MSB resistor string and output $2^n$ decoded codes;
   a logic sequential generation circuit, connected to the decoding circuit and configured to perform a logic operation on a middle-position code among the $2^n$ decoded codes and a refresh clock signal in non-overlapping sequences, and output two groups of control signals with completely complementary high level durations;
   a control signal bootstrap circuit, connected to the logic sequential generation circuit and configured to boost the control signals so that a high level of each of the control signals is increased to a sum of a power supply voltage and a threshold voltage; and
   a first switch group, connected to the control signal bootstrap circuit and the intermediate level resistor string, and configured to be turned on or off according to the boosted control signals.

2. The control system for segmented resistor string type digital to analog converter according to claim 1, wherein the first switch group adopts a switch of a field effect transistor structure.

3. The control system for segmented resistor string type digital to analog converter according to claim 1, wherein the high level switch group adopts a switch of a single PMOS transistor structure.

4. The control system for segmented resistor string type digital to analog converter according to claim 1, wherein the ground level switch group adopts a switch of a single NMOS transistor structure.

5. The control system for segmented resistor string type digital to analog converter according to claim 1, wherein each switch of the first switch group corresponds to a complementary switch.

6. The control system for segmented resistor string type digital to analog converter according to claim 1, wherein: the control signal bootstrap circuit comprises a transistor M1, a transistor M2, a transistor M3, a transistor M4, a transistor M5, a transistor M6, a transistor M7, a transistor M21, and a transistor M22;
   a first clock signal is input into a gate electrode of the transistor M3 and a gate electrode of the transistor M4, a drain electrode of the transistor M3 is connected to a drain electrode of the transistor M4, a source electrode of the transistor M3 is connected to the power supply voltage, and a source electrode of the transistor M4 is grounded;
   a second clock signal is input into a gate electrode of the transistor M6 and a gate electrode of the transistor M7, a source electrode of the transistor M6 is connected to the power supply voltage, a source electrode of the transistor M7 is grounded, and a drain electrode of the transistor M6 is connected to a drain electrode of the transistor M7;
   a source electrode of the transistor M5 is connected to the power supply voltage, and a gate electrode of the transistor M5 is connected to a drain electrode of the transistor M5, and then is connected to a source electrode of the transistor M1;

a common connection point between the drain electrode of the transistor M6 and the drain electrode of the transistor M7 is connected to the source electrode of the transistor M1;

a common connection point between the drain electrode of the transistor M3 and the drain electrode of the transistor M4 is simultaneously connected to a gate electrode of the transistor M1, a gate electrode of the transistor M2, a gate electrode of the transistor M21 and a gate electrode of the transistor M22; and a common connection point between a drain electrode of the transistor M1 and a drain electrode of the transistor M2 outputs a high-level signal H1, a source electrode of the transistor M2 is connected to a drain electrode of the transistor M21, a source electrode of the transistor M21 is connected to a drain electrode of the transistor M22, and a source electrode of the transistor M22 is grounded.

7. The control system for segmented resistor string type digital to analog converter according to claim 6, wherein: the control signal bootstrap circuit further comprises a NOT gate I5, a NOT gate I6 and a NOT gate I7; and the NOT gate I5, the NOT gate I6 and the NOT gate I7 are connected sequentially, the first clock signal is input into the NOT gate I5, and the NOT gate I7 outputs a low-level signal N1.

8. The control system for segmented resistor string type digital to analog converter according to claim 6, wherein the transistor M2, the transistor M21, the transistor M22, the transistor M4 and the transistor M7 are all NMOS transistors.

9. The control system for segmented resistor string type digital to analog converter according to claim 6, wherein the transistor M3, the transistor M1, the transistor M5 and the transistor M6 are all PMOS transistors.

10. The control system for segmented resistor string type digital to analog converter according to claim 6, wherein the control signal bootstrap circuit further comprises an electrolytic capacitor C1, a negative electrode of the electrolytic capacitor C1 is connected to the common connection point between the drain electrode of the transistor M6 and the drain electrode of the transistor M7, and a positive electrode of the electrolytic capacitor C1 is connected the source electrode of the transistor M1.

11. A segmented resistor string type digital to analog converter, comprising:

a most significant bit (MSB) resistor string, comprising a high level resistor string, an intermediate level resistor string and a ground level resistor string;

a decoding circuit, configured to decode an n-bit code of the MSB resistor string and output $2^n$ decoded codes;

a logic sequential generation circuit, connected to the decoding circuit and configured to perform a logic operation on a middle-position code among the $2^n$ decoded codes and a refresh clock signal in non-overlapping sequences, and output two groups of control signals with completely complementary high level durations;

a control signal bootstrap circuit, connected to the logic sequential generation circuit and configured to boost the control signals so that a high level of each of the control signals is increased to a sum of a power supply voltage and a threshold voltage; and a first switch group, connected to the control signal bootstrap circuit and the intermediate level resistor string, wherein the first switch group is controlled by the boosted control signals to be turned on or off, so as to connect the intermediate level resistor string to the circuit or disconnect the intermediate level resistor string from the circuit.

12. The segmented resistor string type digital to analog converter according to claim 11, further comprising:

a high level switch group, configured to be connected to the high level resistor string, and connect the high level resistor string to the circuit or disconnect the high level resistor string from the circuit according to on/off of the high level switch group;

a ground level switch group, configured to be connected to the ground level resistor string, and connect the ground level resistor string to the circuit or disconnect the ground level resistor string from the circuit according to on/off of the ground level switch group; and a least significant bit (LSB) resistor string, connected to the MSB resistor string through the ground level switch group.

13. The segmented resistor string type digital to analog converter according to claim 12, wherein the high level switch group adopts a switch of a single PMOS transistor structure, and the ground level switch group adopts a switch of a single NMOS transistor structure.

14. The segmented resistor string type digital to analog converter according to claim 11, wherein the first switch group adopts a switch of a complementary metal oxide semiconductor field effect transistor structure.

15. The segmented resistor string type digital to analog converter according to claim 11, wherein each switch of the first switch group corresponds to a complementary switch.

16. The segmented resistor string type digital to analog converter according to claim 11, wherein: the control signal bootstrap circuit comprises a transistor M1, a transistor M2, a transistor M3, a transistor M4, a transistor M5, a transistor M6, a transistor M7, a transistor M21 and a transistor M22;

a first clock signal is input into a gate electrode of the transistor M3 and a gate electrode of the transistor M4, a drain electrode of the transistor M3 is connected to a drain electrode of the transistor M4, a source electrode of the transistor M3 is connected to the power supply voltage, and a source electrode of the transistor M4 is grounded;

a second clock signal is input into a gate electrode of the transistor M6 and a gate electrode of the transistor M7, a source electrode of the transistor M6 is connected to the power supply voltage, a source electrode of the transistor M7 is grounded, and a drain electrode of the transistor M6 is connected to the drain electrode of the transistor M7;

a source electrode of the transistor M5 is connected to the power supply voltage, and a gate electrode of the transistor M5 is connected to a drain electrode of the transistor M5, and then is connected to a source electrode of the transistor M1;

a common connection point between the drain electrode of the transistor M6 and the drain electrode of the transistor M7 is connected to the source electrode of the transistor M1;

a common connection point between the drain electrode of the transistor M3 and the drain electrode of the transistor M4 is simultaneously connected to a gate electrode of the transistor M1, a gate electrode of the transistor M2, a gate electrode of the transistor M21 and a gate electrode of the transistor M22;

a common connection point between a drain electrode of the transistor M1 and a drain electrode of the transistor M2 outputs a first signal H1, a source electrode of the transistor M2 is connected to a drain electrode of the transistor M21, a source electrode of the transistor M21 is connected to a drain electrode of the transistor M22, and a source electrode of the transistor M22 is grounded; and the transistor M2, the transistor M21, the transistor M22, the transistor M4 and the transistor M7 are all NMOS transistors, and the transistor M3, the transistor M1, the transistor M5 and the transistor M6 are all PMOS transistors.

17. The segmented resistor string type digital to analog converter according to claim 16, wherein: the control signal bootstrap circuit further comprises a NOT gate I5, a NOT gate I6 and a NOT gate I7;

the NOT gate I5, the NOT gate I6 and the NOT gate I7 are connected sequentially, the NOT gate I5 inputs the first clock signal, the NOT gate I7 outputs a second signal N1, and the second signal N1 is opposite to the first signal H1.

18. The segmented resistor string type digital to analog converter according to claim 16, wherein the control signal bootstrap circuit further comprises an electrolytic capacitor C1, a negative electrode of the electrolytic capacitor C1 is connected to the common connection point between the drain electrode of the transistor M6 and the drain electrode of the transistor M7, and a positive electrode of the electrolytic capacitor C1 is connected to the source electrode of the transistor M1.

* * * * *